(12) United States Patent
Fujita

(10) Patent No.: US 8,239,809 B2
(45) Date of Patent: Aug. 7, 2012

(54) 3-DIMENSIONAL INTEGRATED CIRCUIT DESIGNING METHOD

(75) Inventor: Shinobu Fujita, Inagi (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 400 days.

(21) Appl. No.: 12/504,272

(22) Filed: Jul. 16, 2009

(65) Prior Publication Data

US 2010/0072614 A1   Mar. 25, 2010

(30) Foreign Application Priority Data

Sep. 25, 2008  (JP) ................................. 2008-245972

(51) Int. Cl.
*G06F 17/50* (2006.01)
(52) U.S. Cl. .................. 716/131; 716/119; 716/129
(58) Field of Classification Search .................. None
See application file for complete search history.

(56) References Cited

U.S. PATENT DOCUMENTS

| | | | | |
|---|---|---|---|---|
| 7,228,518 B2 * | 6/2007 | Snider | ............ | 716/126 |
| 7,721,232 B2 | 5/2010 | Ejury | | |
| 7,949,984 B2 * | 5/2011 | Tanamoto et al. | ............ | 716/124 |
| 2005/0170600 A1 | 8/2005 | Fukuzo | | |
| 2006/0168551 A1 * | 7/2006 | Mukuno | ............ | 716/5 |
| 2008/0211540 A1 | 9/2008 | Fujita | | |
| 2008/0241996 A1 | 10/2008 | Fujita | | |
| 2008/0244489 A1 | 10/2008 | Tanamoto et al. | ................ | 716/8 |

FOREIGN PATENT DOCUMENTS

| | | |
|---|---|---|
| JP | 9289253 A | 11/1997 |
| JP | 2863613 B2 | 3/1999 |
| JP | 200243876 A | 9/2000 |
| JP | 2007-250754 | 9/2007 |

OTHER PUBLICATIONS

Gupta et al., "Optimal 2-D Cell Layout with Integrated Transistor Folding," 1998, ACM, pp. 128-135.*
Loi et al., "A Thermally-Aware Performance Analysis of Vertically Integrated (3-D) Processor-Memory Hierarchy," DAC 2006, pp. 991-996.*
Puttaswamy et al., "Scalability of 3D-Integrated Arithmetic Units in High-Performance Microprocessors," DAV 2007, pp. 622-625.*
Topol et al., "Enabling SOI-Based Assembly Technology for Three-Dimension (3D) Integrated Circuits (ICs)," IBM, no date, 4 pages.*

(Continued)

*Primary Examiner* — Leigh Garbowski
(74) *Attorney, Agent, or Firm* — Ohlandt, Greeley, Ruggiero & Perle, L.L.P.

(57) ABSTRACT

A 3-dimensional integrated circuit designing method includes forming a temporary layout region for an original integrated circuit on an XY plane, the plane being short in an X direction and long in a Y direction perpendicular to the X direction, dividing the temporary layout region into 2N (N is an integral number of not smaller than 2) or more subregions in the Y direction, configuring one block for every successive N subregions to prepare a plurality of blocks, and forming N layers of layout by alternately folding each of the blocks in the Y direction in units of one subregion to selectively set a kN-th (k is an integral number not less than 1) subregion and (kN+1)th subregion of each block to one of an uppermost layer and lowermost layer.

9 Claims, 10 Drawing Sheets

OTHER PUBLICATIONS

Cong, et al., *"Thermal-Aware 3D IC Placement Via Transformation"*, Department of Computer Science, University of California, Los Angeles, 6 pages, Jan. 2007.

Japanese Office Action dated Feb. 20, 2009 for Japanese Patent Application No. 2007-079967 with English translation.

Takahasha, et al.. "Current Status of Research and Development for Three-Dimensional Chip Stack Technology", Jpn. J. Appl. Phys., vol. 40, Apr. 2001, pp. 3032-3037.

* cited by examiner

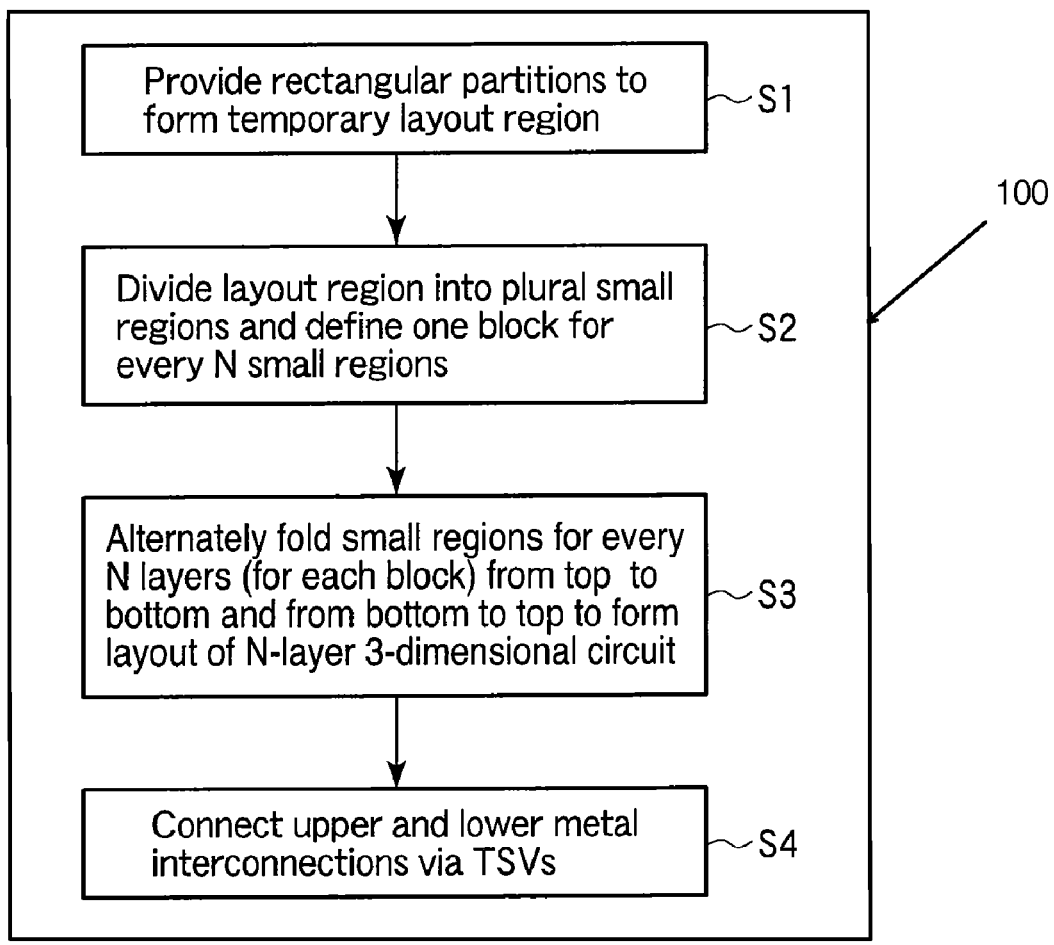
F I G. 1

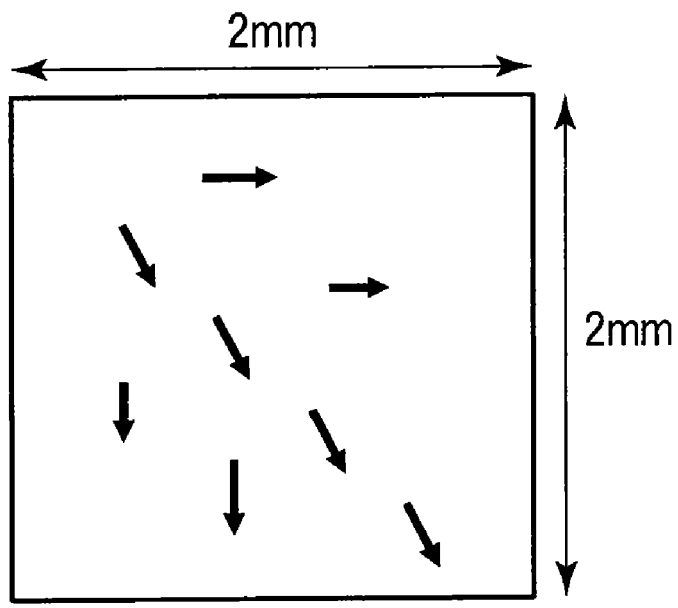
F I G. 2A
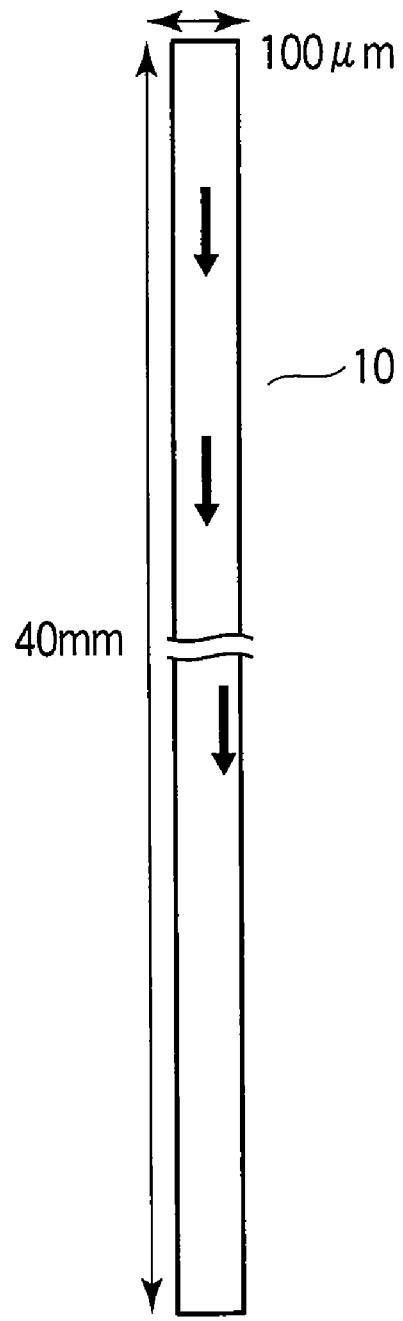
F I G. 2B

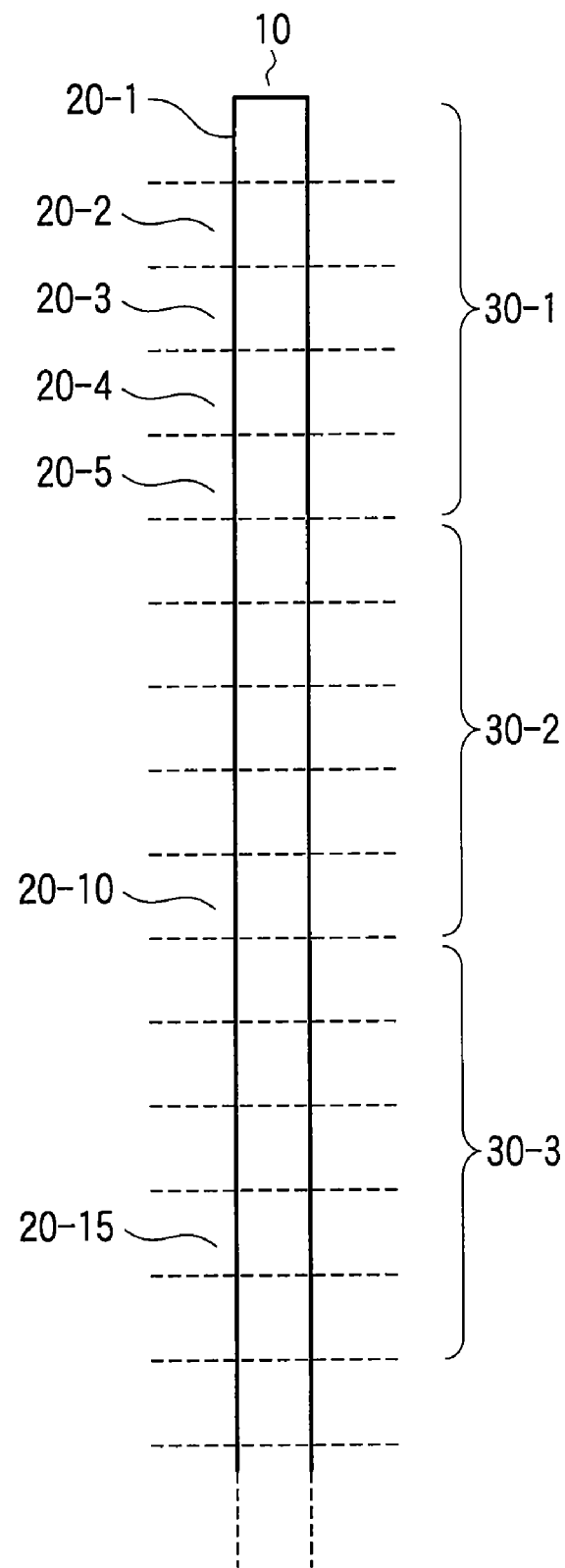
F I G. 3

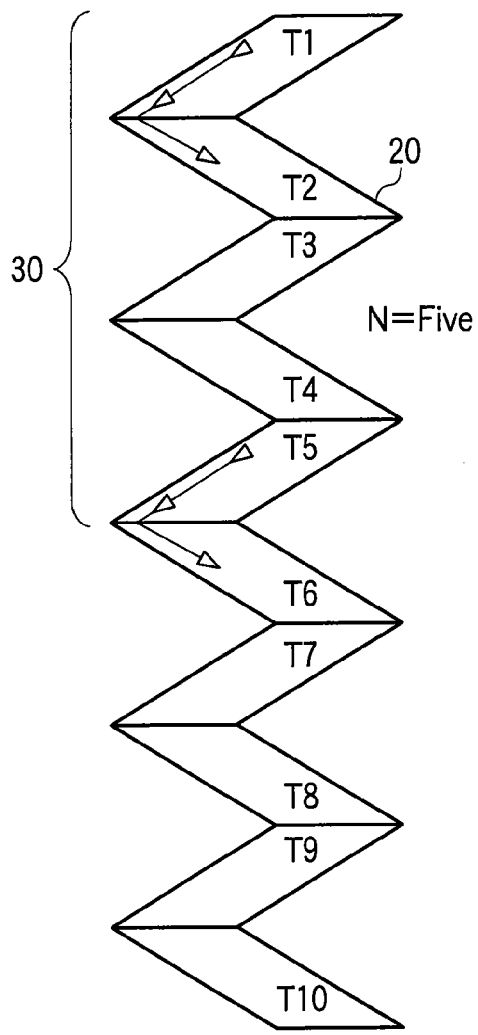
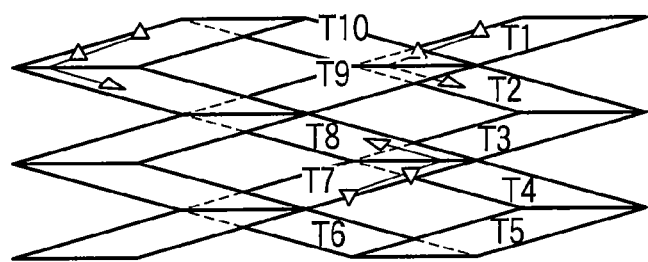
FIG. 4B
FIG. 4A
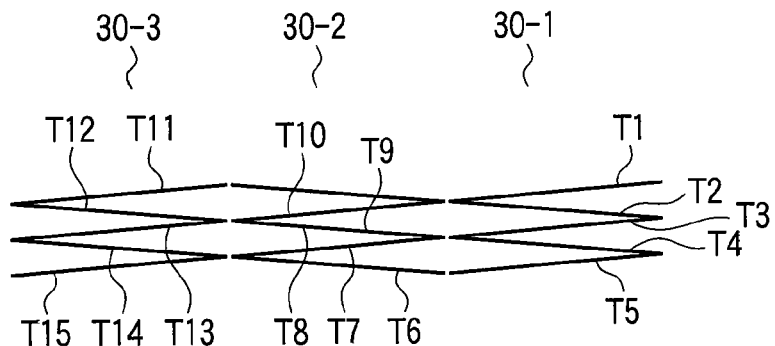
FIG. 5

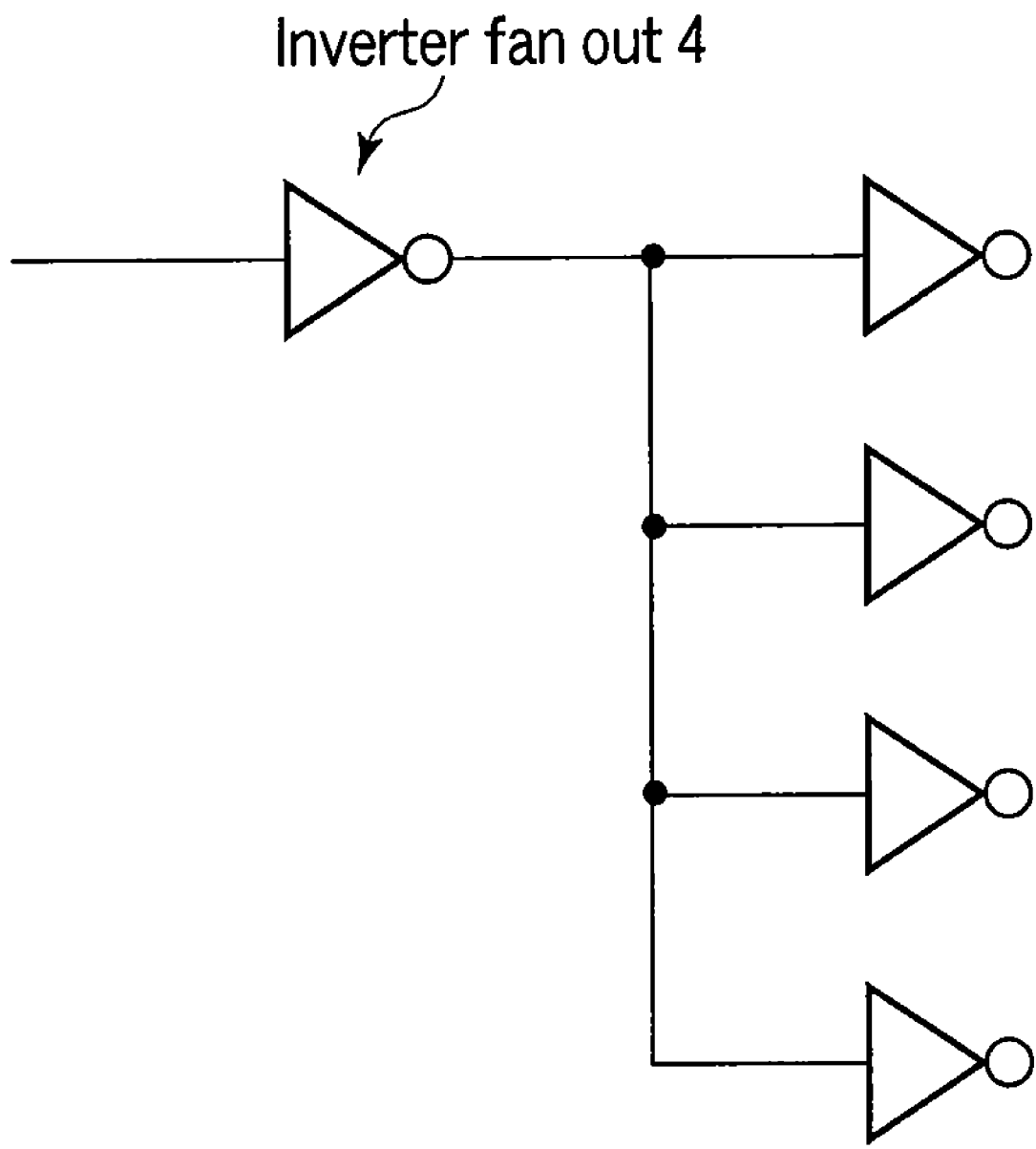
F I G. 12

3-DIMENSIONAL INTEGRATED CIRCUIT DESIGNING METHOD

CROSS-REFERENCE TO RELATED APPLICATIONS

This application is based upon and claims the benefit of priority from prior Japanese Patent Application No. 2008-245972, filed Sep. 25, 2008, the entire contents of which are incorporated herein by reference.

BACKGROUND OF THE INVENTION

1. Field of the Invention

This invention relates to a 3-dimensional integrated circuit designing method of layout for stacking and arranging integrated circuits. Further, this invention relates to a 3-dimensional integrated circuit formed by use of the above method and to a computer readable medium encoded with a computer program to perform the above method.

2. Description of the Related Art

Recently, with the miniaturization of CMOS devices, a delay associated with interconnects becomes relatively longer in comparison with a delay caused by transistors themselves. Therefore, the delay associated with interconnects becomes a factor dominating the performance of the integrated circuit. For example, in an example of a CMOS inverter, if the inverter is further miniaturized, a delay associated with interconnects becomes longer than a delay caused by the inverter. In order to reduce the delay associated with interconnects, it is necessary to reduce the number of long interconnects. As will be described later, according to experiments performed by the inventor of this application and others, it is understood that it is necessary to reduce the number of interconnects whose lengths are larger than 100 µm. As a method for reducing the number of interconnects that are long, it is said that it is desirable to use a method for stacking circuits in a 3-dimensional fashion.

However, even if a 3-dimensional stacking technique is used, a sufficient effect cannot be attained when a simple layout is made. For example, in an integrated circuit chip having one side of 10 mm, the maximum length of the interconnect becomes approximately 20 mm. In a case where four portions obtained by equally dividing the chip are stacked, it is understood that the number of interconnects whose lengths are larger than 100 µm is almost unchanged when the distribution of interconnect lengths of the integrated circuit is derived by calculation. That is, the effect that the delay associated with interconnects is reduced cannot be substantially attained simply if the circuits are stacked into four layers.

In order to reduce the number of interconnects whose lengths are larger than 100 µm, the number of stacked layers must be extremely increased. For example, if the chip is divided into 100 portions and the divided portions are stacked, the length of the interconnect becomes approximately 200 µm at maximum, and as a result, interconnects whose lengths are larger than 100 µm are mostly eliminated. However, as the number of stacked layers becomes larger, heat conductance is lowered and the cost for the stacking process becomes higher. For this reason, it is considered that an adequate number of stacked layers is approximately 10 or less. Therefore, it is desired to provide a layout method capable of reducing the number of interconnects whose lengths exceed 100 µm even if the number of stacked layers is set to approximately 10 or less.

In order to solve the above problem, a method for folding and making the layout of a 2-dimensional integrated circuit as is used in the art of folding origami paper is proposed (JP-A 2007-250754 (KOKAI) or J. Cong, G. Luo, J. Wei, and Y. Zhang, "Thermal-Aware 3D IC Placement via Transformation," Proceedings of the 12$^{th}$ Asia and South Pacific Design Automation Conference (ASP-DAC 2007), Yokohama, Japan, pp. 780-785, January 2007). However, even if the above methods are used, the interconnect length can be reduced only to the length of one side obtained after folding. That is, basically, the above problem cannot be solved. In other words, the interconnect length cannot be sufficiently reduced if the number of stacked layers is set to an extremely large number.

BRIEF SUMMARY OF THE INVENTION

According to one aspect of this invention, there is provided a 3-dimensional integrated circuit designing method that includes forming a temporary layout region for an original integrated circuit on an XY plane, the plane being short in an X direction and long in a Y direction perpendicular to the X direction, dividing the temporary layout region into 2N (N is an integral number of not smaller than 2) or more subregions in the Y direction, configuring one block for every successive N subregions to prepare a plurality of blocks, and forming N layers of layout by alternately folding each of the blocks in the Y direction in units of one subregion to selectively set a kN-th (k is an integral number not less than 1) subregion and (kN+1)th subregion of each block to one of an uppermost layer and lowermost layer.

According to another aspect of this invention, there is provided a 3-dimensional integrated circuit that includes 2N (N is an integral number not smaller than 2) or more division regions obtained by dividing an original integrated circuit including integrated circuits arranged in a temporary layout region on an XY plane, the plane being short in an X direction and long in a Y direction perpendicular to the X direction in the Y direction, a plurality of blocks each configured by N division regions, and a structure having N layers of layout formed by folding each of the blocks in the Y direction in units of one division region to selectively set a kN-th (k is an integral number not smaller than 1) division region and (kN+1)th division region of each block to one of an uppermost layer and lowermost layer.

According to a further aspect of this invention, there is provided a computer readable medium encoded with a computer program for arranging and interconnecting an original integrated circuit including integrated circuits in a 3-dimensional form, which when executed by a computer results in performance of steps comprising: forming a temporary layout region for the original integrated circuit on an XY plane, the plane being short in an X direction and long in a Y direction perpendicular to the X direction, dividing the temporary layout region into 2N (N is an integral number of not smaller than 2) or more subregions in the Y direction, configuring one block for every successive N subregions to prepare a plurality of blocks, and forming N layers of layout by alternately folding each of the blocks in the Y direction in units of one subregion to selectively set a kN-th (k is an integral number not less than 1) subregion and (kN+1)th subregion of each block to one of an uppermost layer and lowermost layer.

BRIEF DESCRIPTION OF THE SEVERAL VIEWS OF THE DRAWING

FIG. 1 is a flowchart for illustrating an arranging and interconnecting method for a 3-dimensional stacked integrated circuit according to a first embodiment of this invention.

FIGS. 2A and 2B are views showing a 2-dimensional arrangement before stacking integrated circuits.

FIG. 3 is a view showing the state in which a temporary layout region is divided in a vertical direction.

FIGS. 4A and 4B are views showing the state in which the temporary layout region is folded.

FIG. 5 is a view showing the final state in which the temporary layout region is folded.

FIG. 12 is a diagram showing the circuit configuration of a CMOS inverter fan out.

DETAILED DESCRIPTION OF THE INVENTION

Now, the present invention will be explained in detail with reference to embodiments shown in the accompanying drawings.

First Embodiment

Figure 11:
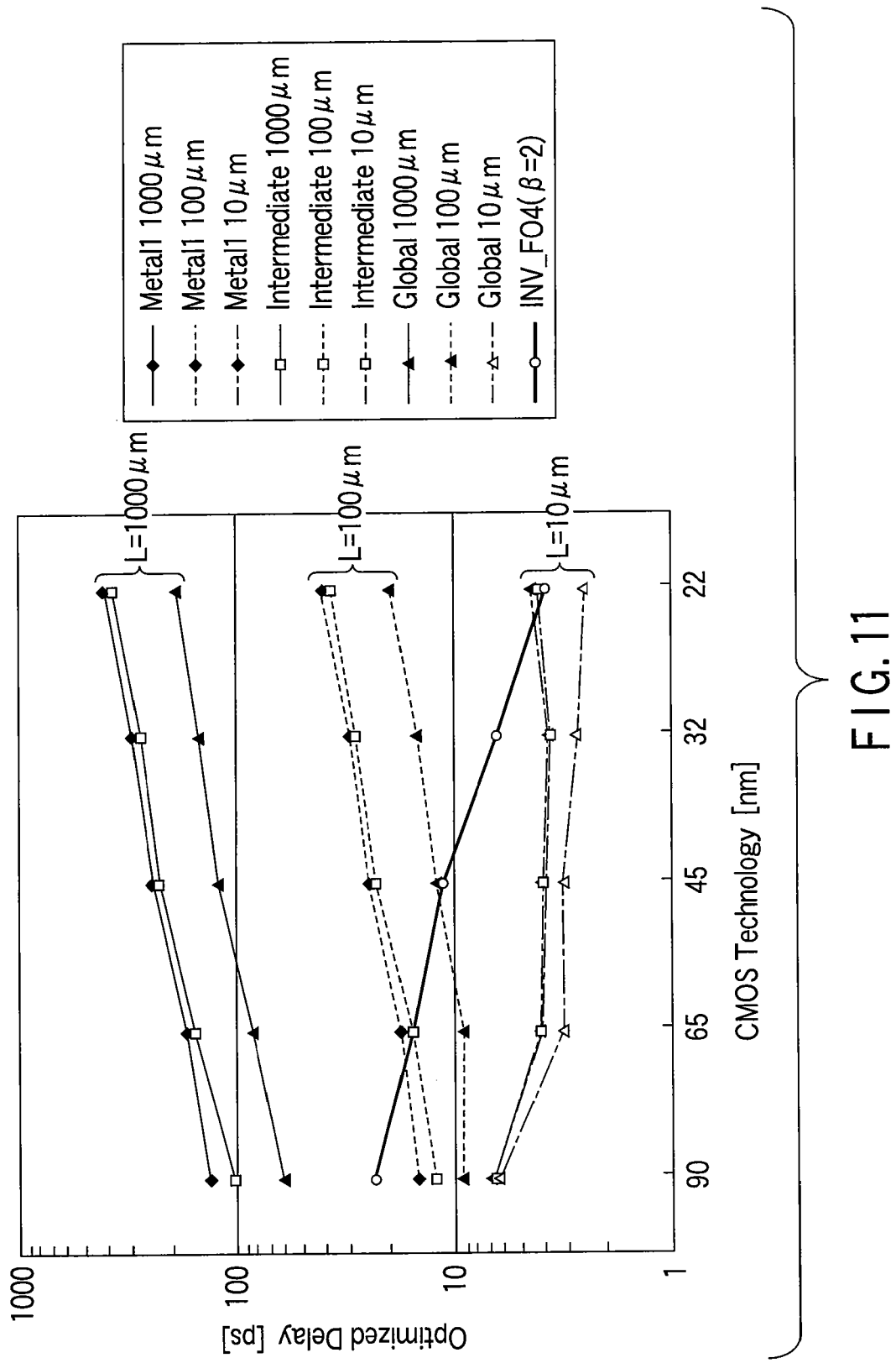
FIG. 11 is a diagram showing the results of calculations for delays of interconnects with the lengths of 10, 100 and 1000 μm.

As is explained in the item of "BACKGROUND OF THE INVENTION", a method for stacking an integrated circuit in a 3-dimensional form is desirable in order to reduce an interconnect delay. FIG. 11 shows the results of calculations for delays of interconnects. The abscissa indicates a device feature size of a CMOS process. In FIG. 11, the thick solid line indicates a delay of a CMOS inverter fan out (INV FO4) as shown in FIG. 12.

As shown in FIG. 11, in the case of L=10 μm, a delay associated with interconnects is shorter than a delay caused by the inverter even in a 32 nm rule. In the case of L=100 μm, a delay associated with interconnects is shorter than a delay caused by the inverter in a 90 nm rule. In a 65 nm rule, a delay associated with interconnects is shorter than or substantially equal to a delay caused by the inverter. In a 45 nm rule, a delay associated with interconnects is slightly longer than or equal to a delay caused by the inverter. In the case of L=1000 μm, a delay associated with interconnects is longer than a delay caused by the inverter even in a 90 nm rule.

Thus, with miniaturization of the circuit, the delay caused by the interconnects becomes longer than the delay caused by the inverter. Therefore, when taking a case of a rule of up to the 45 nm into consideration, it becomes necessary to reduce the interconnect length to approximately 100 μm in order to reduce the interconnect delay.

In order to attain this, in this embodiment, as shown in the flowchart of FIG. 1, which is illustrated encoded on a computer readable medium 100, a 3-dimensional layout is formed by folding the layout of a 2-dimensional integrated circuit in the manner of folding origami paper and folding back the layout for every preset number. An object of this embodiment is a logic circuit block in which transistors and interconnects are automatically laid out by use of CAD. Layout indicates physical layout, and this means the layout on the mask for the lithography that makes the integrated circuit.

First, rectangular partitions are provided to set the interconnects (signal transmission lines) of the circuit block in a unidimensional direction and a temporary layout region is formed (step S1).

Next, the layout region is divided into 2N (N is a positive integral number) or more subregions and one block is formed for every N subregions (step S2). In this case, N indicates the number of stacked layers of a 3-dimensional integrated circuit.

Then, the subregions are alternately folded back for every N layers (the number of stacked layers of the 3-dimensional circuit) from the top to the bottom and from the bottom to the top to form a layout of the N-layer 3-dimensional circuit (step S3).

Subsequently, the metal interconnects of the upper and lower layers (subregions) are connected by use of TSVs (through silicon vias: substrate penetration electrodes) and portions of the upper and lower interconnects that extend over the folding portions are eliminated (step S4).

Next, the arrangement and interconnect method of this embodiment is explained more in detail.

FIG. 2A shows an example of a 2-dimensional arrangement before stacking layers and shows an existing logic circuit block. In this case, signal transmission directions (directions of metal interconnects) are set on a plane (not in one direction but in various directions) and the circuit block is not suitable for a folding type layout.

Therefore, in this embodiment, as shown in FIG. 2B, a partition (a boundary region of the layout) is set in a longitudinal form (rectangular form). Thus, the signal transmission direction is set in a unidimensional direction and the arrangement becomes suitable for folding. The region is called a temporary layout region 10. At this time, the ideal partition size is set to be 100 μm in the lateral direction (X direction) and 40 mm in the vertical direction (Y direction). Since the lateral width is 100 μm, the interconnect length in the lateral direction is 100 μm or less.

Next, as shown in FIG. 3, the temporary layout region 10 is divided into subregions 20 (20-1, 20-2, . . . ) of 100 μm in the vertical direction. In this case, one block 30 (30-1, 30-2, . . . ) is defined for every N (for example, five) subregions 20.

Next, as shown in FIGS. 4A, 4B, each block 30 is folded in the subregion unit to set the vertical length to 100 μm. In this example, the number of stacked layers of the 3-dimensional stacked-layer circuit is five. The layers obtained by folding are set to T1, T2, . . . , T400. In FIG. 4A, the layers up to T10 are shown. Then, the layers are folded for every five layers to form the structure of FIG. 4B. At this time, the T5 layer and T6 layer, T10 layer and T11 layer, . . . are connected with the same layer of the uppermost surface or lowermost surface. That is, the T(5k) layer and T(5k+1) layer (k is a positive integral number) are connected with the same layer of the uppermost surface or lowermost surface.

It looks as if the folded portions of the block 30-1 of T1 to T5 and the block 30-2 of T6 to T10 are overlapped, but in practice, the adjacent blocks 30 are not overlapped as shown in FIG. 5.

Figure 6A:
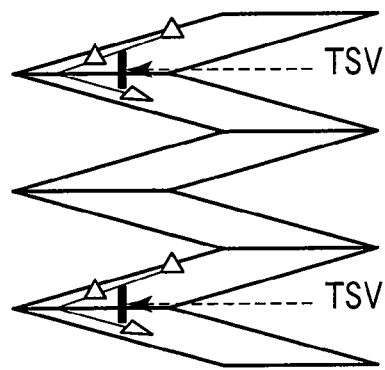
FIGS. 6A and 6B are views showing the state in which a shortcut is provided between adjacent layers.
Figure 6B:
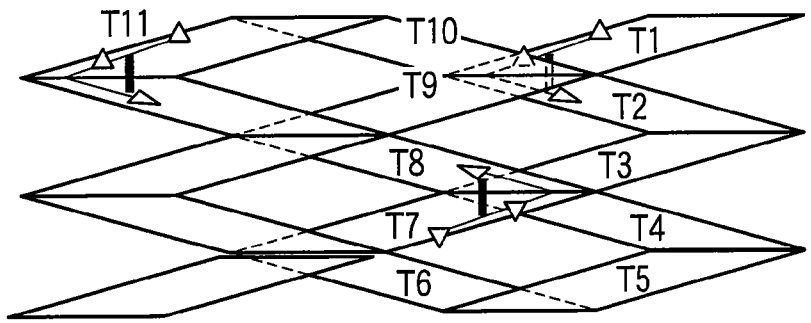

Next, as shown in FIGS. 6A, 6B, the interconnects provided over the layers that are adjacent in the vertical direction and used for transmitting the same signal are connected via a TSV to form a shortcut. As a result, the interconnect delay can be made short and a repeater buffer can be omitted. Since the power consumption of the repeater buffer is large, this contributes to a reduction in the power consumption of the whole circuit.

Figure 7:
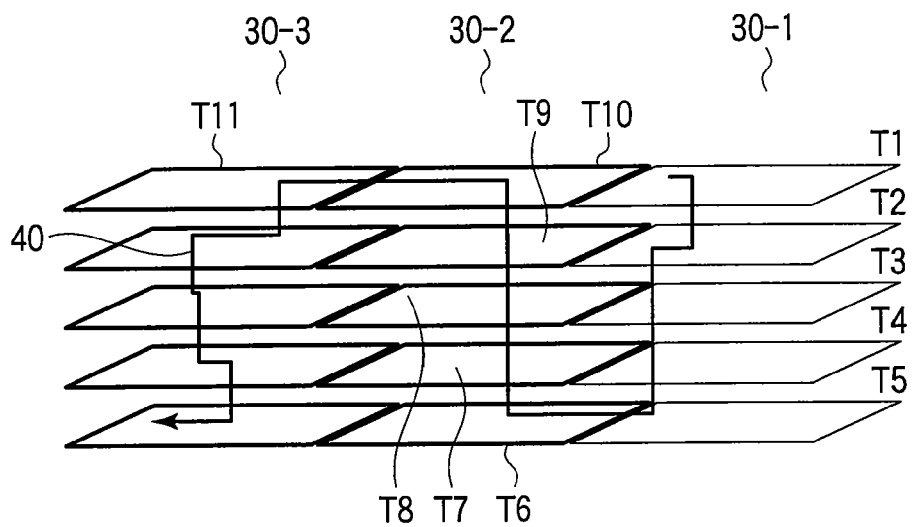
FIG. 7 is a view showing the layout of 3-dimensional circuit blocks of five layers formed in the first embodiment.

Finally, the layout of a 3-dimensional integrated circuit block formed of five layers as shown in FIG. 7 is completed. Clock lines and power supply lines are provided by use of the conventional automatic designing method. The clock lines and power supply lines can also be shortened, a clock skew can be made smaller and the power consumption can be reduced. A symbol 40 in FIG. 7 indicates one example of an interconnect extending over a plurality of layers.

Figure 8:
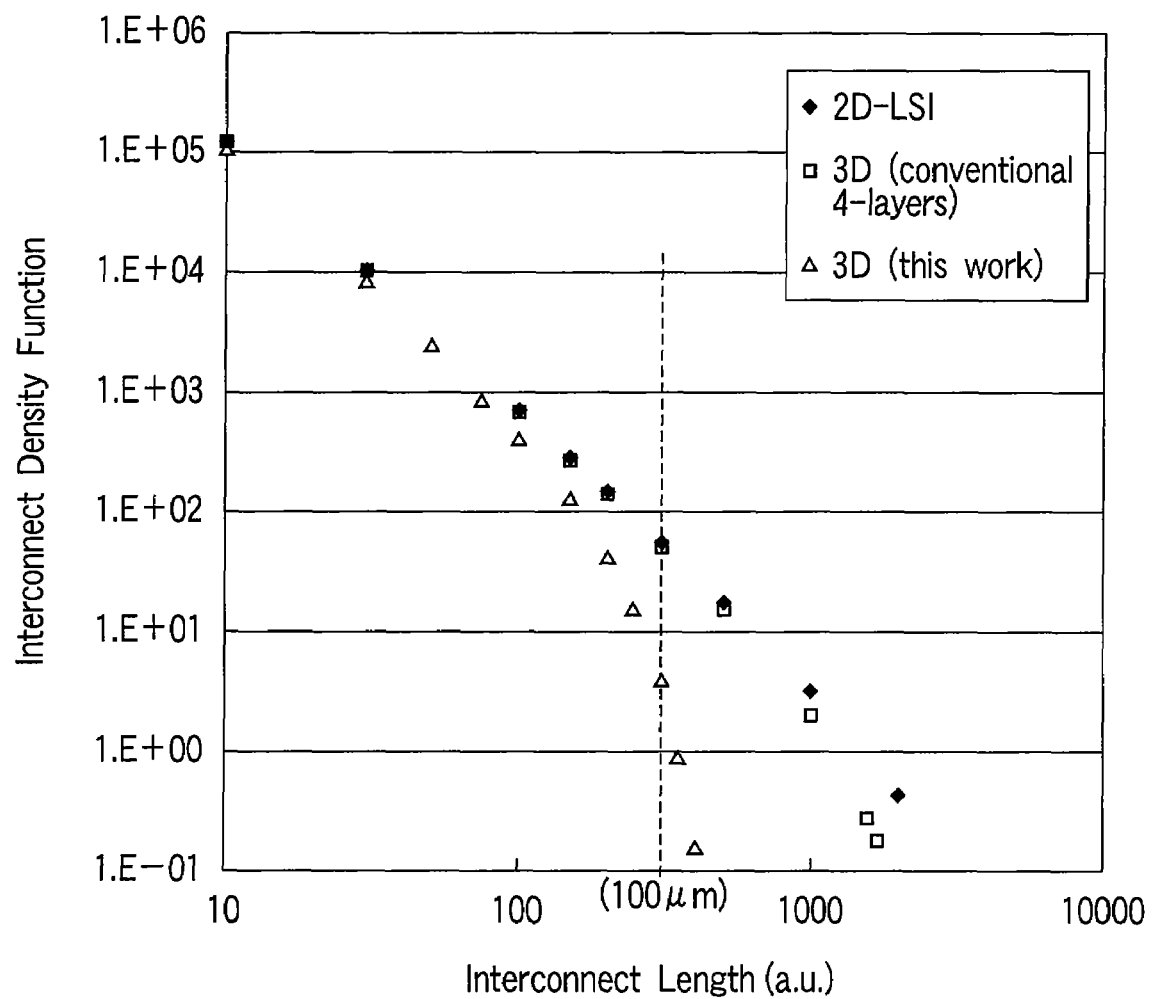
FIG. 8 is a diagram showing a variation in the interconnect length distribution in the first embodiment in comparison with that of the conventional case.

The results of calculations for interconnect length distribution in the 3-dimensional integrated circuit formed in this embodiment are shown in FIG. 8. The results are obtained by calculating interconnect length distribution by use of a statistical theory of the interconnect length distribution in a chip with 10,000,000 gates in a CMOS circuit of 65 nm technology. Plots ♦ in FIG. 8 indicate the interconnect distribution of an original chip. Further, plots ☐ indicate the interconnect distribution in the case where the layout of FIG. 2A is divided into four layers that are stacked and plots Δ indicate the interconnect distribution in the case where the layout of FIG. 2B is divided into 400 layers according to this embodiment.

It is clearly understood from FIG. 8 that the number of interconnects is kept substantially unchanged in the case where the layout is divided into four stacked layers as in the conventional case with attention paid to the interconnects of 100 μm. That is, the effect of improvement of the interconnect delay cannot be substantially attained simply by stacking four layers. On the other hand, in this embodiment, it is understood that the number of interconnects of 100 μm is reduced by one digit or more if the layout is divided into 400 layers although the number of stacked layers is five. Therefore, a portion for controlling the interconnect delay can be almost completely omitted. In this case, the repeater buffer can be reduced by 94%. Since the power in the repeater buffer occupies a large part of the power of the whole circuit, the effect of lowering the power consumption can be attained.

Figure 9:
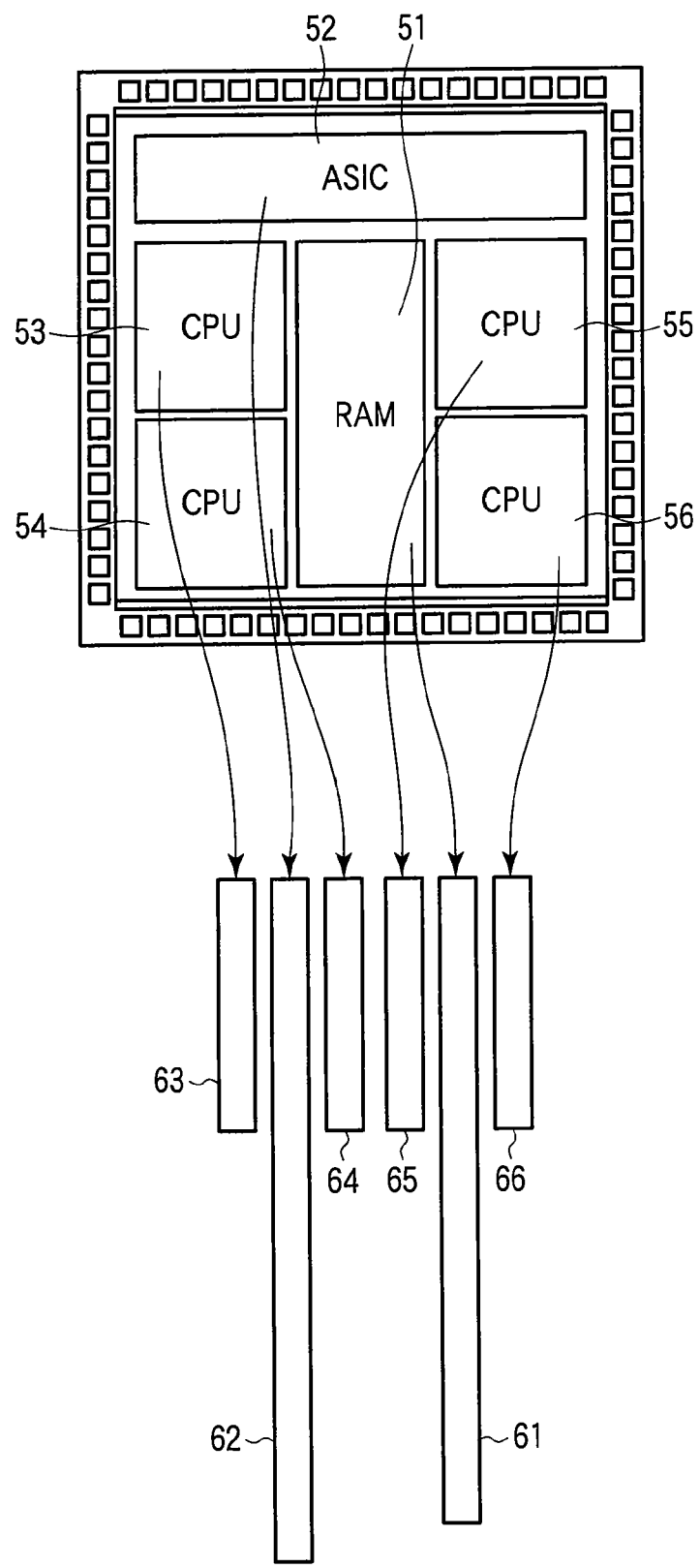
FIG. 9 is a view showing an example in a case where the first embodiment is applied to a plurality of function blocks.

FIG. 9 shows an example in a case where the function block of a rectangular form in the 2-dimensional layout is modified into a layout that is long in the vertical direction. As shown in the upper portion of FIG. 9, a plurality of function blocks such as a RAM 51, ASIC 52 and four CPUs 53 to 56 are contained in the 2-dimensional layout data.

In this embodiment, it is necessary to modify the above blocks into longitudinal layouts, but it is difficult to modify the layout extending over the plural function blocks. Therefore, as shown by the lower portion of FIG. 9, each function block is modified into a longitudinal layout. In FIG. 9, symbols 61 to 66 indicate layout regions corresponding to the circuits 51 to 56. Then, the folding process is performed according to the method of this embodiment and the respective function blocks of 3-dimensional stacked layers may be rearranged on the same substrate.

Thus, according to this embodiment, not only is the layout of the 2-dimensional integrated circuit simply folded, but it is also modified into a longitudinal layout that is short in the X direction and long in the Y direction, then the layout is folded in the subregion unit and folded back in the N-layer unit. Thus, the number of interconnects whose length exceeds 100 μm can be reduced without significantly increasing the number of stacked layers. Therefore, the interconnect delay can be reduced, the power consumption can be lowered and the circuit performance can be enhanced.

Second Embodiment

In the first embodiment explained above, the footprint size of the finally obtained circuit becomes a long and narrow form of 0.1 mm×8 mm. A layout that is close to a square form normally used can be attained by juxtaposing the above block with another circuit block. However, in this embodiment, a shape that is close to a square form is realized by use of only the above circuit block.

Figures 10A, 10B, 10C:
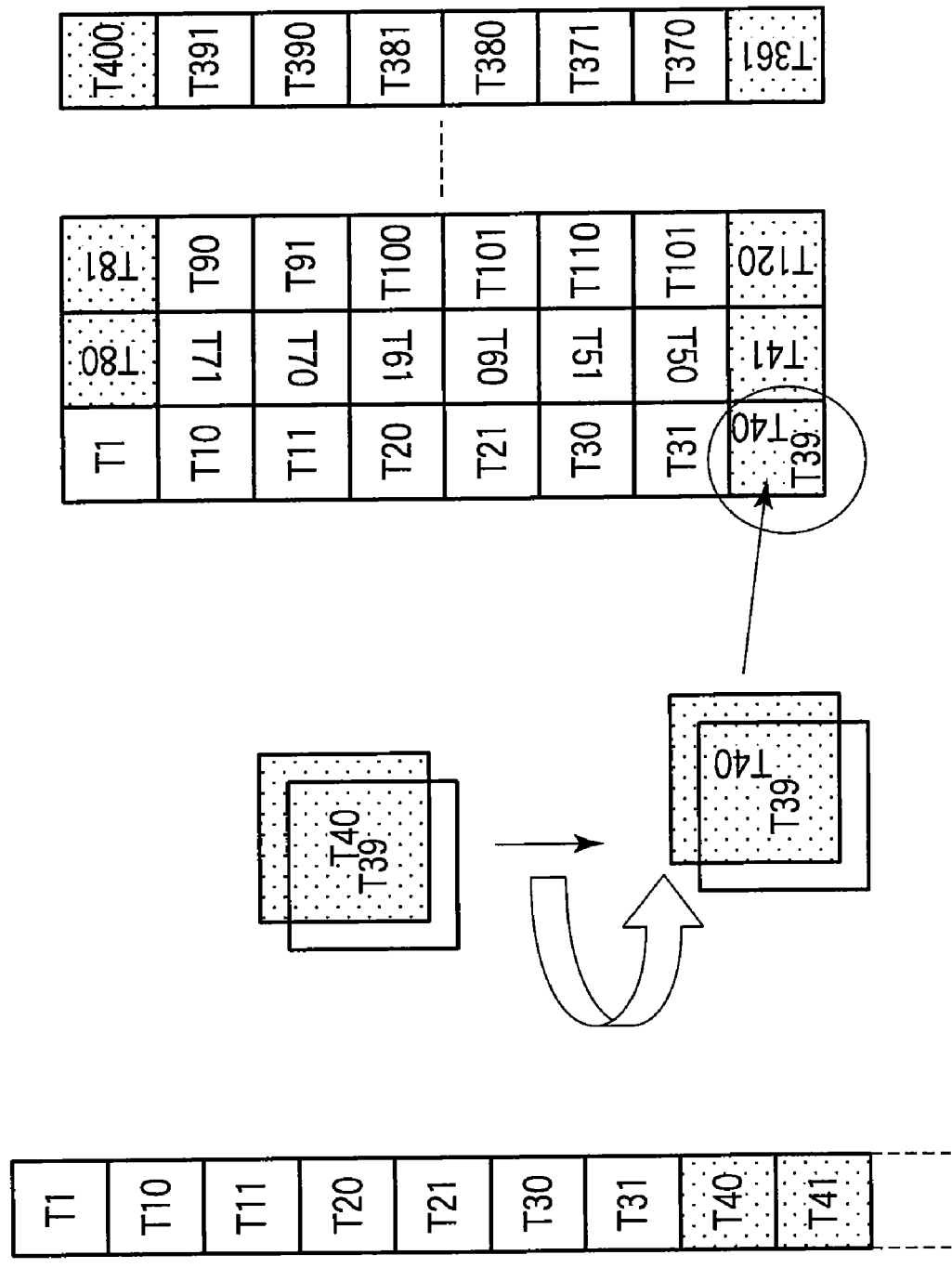
FIGS. 10A to 10C are views showing an example in which stacked portions are not arranged in a layout of a rectangular form that extends in one direction but are arranged in a layout form close to a square, for illustrating a second embodiment of this invention.

FIG. 10A shows the uppermost surface of a 3-dimensional integrated circuit having layers stacked according to the first embodiment. A portion T40 that is connected to a portion T39 is rotated with respect to the portion T39 by 90 degrees in the counterclockwise direction as shown in FIG. 10B. A TSV is fixed with respect to the portion T39 and an interconnect on T40 is additionally provided to correctly connect the portions T39 and T40 to each other. A placement and rounding process may be performed again only for T40 by use of CAD. Likewise, a portion of the lowermost surface T45 of the 3-dimensional integrated circuit that is connected to a portion T44 is rotated with respect to the portion T44 by 90 degrees in the counterclockwise direction.

As a result, since the length of one side of T40 is 100 μm although the interconnect becomes slightly longer, the interconnect length can be set within 100 μm. By performing the same operation for T80, T85, T120, . . . , the circuit can be laid out again as shown in FIG. 10C. In the configuration of FIG. 10C, the length is 0.8 mm, the width is 1 mm and a shape close to a square form is obtained.

Thus, according to this embodiment, it is of course possible to attain the same effect as that of the first embodiment and the finally obtained layout can be set to a square-like shape by rotating some of the subregions. Therefore, the degree of freedom of the arrangement design of the circuit can be enhanced.

MODIFICATION

This invention is not limited to the above embodiments. The length of the temporary layout in the X direction is not limited to 100 μm and can be adequately changed according to the permissible interconnect length. Likewise, the length of a subregion divided in the Y direction is not limited to 100 μm and can be adequately changed according to the permissible interconnect length based on the specification.

Further, the number of stacked layers is not limited to five and can be adequately changed. Generally, when taking the heat conductance and the cost of a process for stacking layers into consideration, it is desirable to set the number of stacked layers to ten or less. Further, it is desirable to set N to an odd number in order to prevent blocks folded for each subregion from being overlapped. If N is an even number, one of the subregions that are successive between the adjacent blocks may be rotated by use of the method explained in the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A 3-dimensional integrated circuit comprising:
2N (N is an integral number not smaller than 2) or more division regions obtained by dividing an original integrated circuit arranged in a temporary layout region on an XY plane, the plane being short in an X direction and long in a Y direction perpendicular to the X direction, a plurality of blocks each configured by N division regions, and a structure having N layers of layout formed by folding the N division regions from the top to the bottom and from the bottom to the top to form the 3-dimensional circuit with the N layers.

2. The circuit according to claim 1, wherein N is 10 or less.

3. The circuit according to claim 1, wherein N is an odd number and a portion between the kN-th and (kN+1)th division regions is made continuous without being folded, wherein the kN-th (k is an integral number not less than 1) and (kN+1)th subregions are both positioned in one of an uppermost layer and a lowermost layer.

4. The circuit according to claim 1, wherein the division regions are stacked up and down by folding each of the blocks in units of one division region and adjacent division regions are connected by a penetration electrode.

5. The circuit according to claim 4, wherein an extra interconnect and repeater buffer are omitted by short-cutting the interconnect that extend over the adjacent subregions by the penetration electrode.

6. The circuit according to claim 1, wherein a length of the temporary layout region in the X direction is 100 μm or less.

7. The circuit according to claim 1, wherein a length of the division region in the Y direction is 100 μm or less.

8. The circuit according to claim 1, wherein a length of the division region in the Y direction is not larger than a length of an interconnect having an interconnect delay equivalent to a delay of a CMOS inverter of a fan out on the integrated circuit.

9. A non-transitory computer readable medium encoded with a computer program for arranging and interconnecting an original integrated circuit in a 3-dimensional form, which when executed by a computer results in performance of steps comprising:

forming a temporary layout region for the original integrated circuit on an XY plane, the plane being short in an X direction and long in a Y direction perpendicular to the X direction, dividing the temporary layout region into 2N (N is an integral number of not smaller than 2) or more subregions in the Y direction, configuring one block for every successive N subregions to prepare a plurality of blocks, and alternately folding the N subregions from the top to the bottom and from the bottom to the top to form the 3-dimensional circuit with N layers.

* * * * *